United States Patent [19]

Okuyama

[11] Patent Number: 5,588,831

[45] Date of Patent: Dec. 31, 1996

[54] FURNACE SYSTEM EQUIPPED WITH PROTECTED COMBUSTION NOZZLE USED IN FABRICATION OF SEMICONDUCTOR DEVICE

[75] Inventor: Satoru Okuyama, Yamagata, Japan

[73] Assignee: NEC Corporation, Tokyo, Japan

[21] Appl. No.: 492,446

[22] Filed: Jun. 19, 1995

[30]     Foreign Application Priority Data

Jun. 23, 1994 [JP] Japan .................................... 6-141421

[51] Int. Cl.[6] .................................................. F27B 3/00
[52] U.S. Cl. .......................................... 432/159; 431/350
[58] Field of Search .................................. 432/241, 136, 432/159; 431/247, 248, 350

[56]         References Cited

U.S. PATENT DOCUMENTS 3,630,649  12/1971  Hancock et al. .......................... 431/350

5,095,872  3/1992  Kawamura .............................. 123/270

Primary Examiner—Noah P. Kamen
Attorney, Agent, or Firm—Whitham, Curtis, Whitham & McGinn

[57]             ABSTRACT

A furnace system is used for oxidizing a semiconductor wafer and diffusing a dopant impurity into the semiconductor wafer, and has a first quartz outlet gas nozzle for injecting oxygen gas, a second quartz outlet gas nozzle for injecting hydrogen so as to be burnt in the oxygen and a guard member surrounding an outlet end of the second outlet gas nozzle for spacing a high-temperature flame therefrom, thereby preventing the second quartz outlet gas nozzle from an aged deterioration due to a serious heat cycle.

18 Claims, 5 Drawing Sheets

FURNACE SYSTEM EQUIPPED WITH PROTECTED COMBUSTION NOZZLE USED IN FABRICATION OF SEMICONDUCTOR DEVICE

FIELD OF THE INVENTION

This invention relates to a furnace system used in a fabrication of semiconductor device and, more particularly, to a furnace system equipped with a protected combustion nozzle used for oxidizing a semiconductor wafer and diffusing a dopant impurity.

DESCRIPTION OF THE RELATED ART

In the fabrication process for a semiconductor device, silicon oxide is thermally grown on a semiconductor wafer, and a dopant impurity is diffused into the semiconductor wafer. The thermal oxidation and the diffusion require a furnace system, and FIG. 1 illustrates a typical example of the furnace system 100 available for the thermal oxidation and the diffusion.

The prior art furnace system 100 comprises a combustion tube 101 and a wafer chamber 102 contiguous to the combustion tube 101. Though not shown in FIG. 1, a controlling sub-system and a loading sub-system are further incorporated in the furnace system 100. A plurality of semiconductor wafers 102a are maintained on a boat 102b, and the boat 102b is placed in the wafer chamber 102.

The combustion tube 101 includes an outer tube member 101a for oxygen gas and an inner tube member 101b for hydrogen gas, and the outer tube member 101a and the inner tube member 101b are formed of quartz. The outer tube member 101a guides the combustion gas toward the wafer chamber 102, and the semiconductor wafers 102a are, by way of example, oxidized in the combustion gas.

An outlet gas nozzle 101c is open at one end portion of the outer tube member 101a, and an oxygen gas source (not shown) is connected to the outlet gas nozzle 101c. On the other hand, the inner tube member 101b is inserted into the outer tube member 101c at the one end portion, and is bent to have a U-shape. As a result, an outlet gas nozzle 101d is directed to the outlet gas nozzle 101c, and hydrogen gas is supplied from a hydrogen gas source (not shown) to the outlet gas nozzle 101d.

While the semiconductor wafers 102a are being treated with heat, the hydrogen gas is injected from the outlet gas nozzle 101d toward the injected oxygen gas, and the hydrogen gas is burnt in the oxygen gas. Then, heat is generated together with steam, and the combustion gas or the high-temperature steam is guided through the outer tube member 101a toward the silicon chamber 102 for the treatment of the semiconductor wafers 102a.

As will be better seen in FIG. 2, the quartz gas nozzle 101d injects the hydrogen gas, and the flame 103 generates the leading end of the outlet gas nozzle 101d. Therefore, the leading end of the outlet gas nozzle 101d is exposed to the high-temperature steam during the combustion.

Another prior art furnace (not illustrated) is disclosed in Japanese Patent Publication of Unexamined Application No. 297826, and the prior art furnace is equipped with a double tube type gas nozzle. The outlet gas nozzle 101d of the inner tube member injects hydrogen gas, and the outlet gas nozzle of the outer tube member supplies oxygen gas to the injected hydrogen gas for the combustion of the hydrogen gas. The flame is generated at the leading end of the outlet gas nozzle of the inner tube member, and the leading end is exposed to high-temperature steam during the combustion. Therefore, the prior art furnace disclosed in Japanese patent Publication of Unexamined Application is similar to the prior art described hereinbefore.

Although yet another prior art furnace has a wafer chamber separated from the combustion chamber, the outlet gas nozzle is exposed to the flame at all times.

These prior art furnace systems encounter a problem in that the semiconductor wafers 102a are contaminated by particles.

SUMMARY OF THE INVENTION

It is therefore an important object of the present invention to provide a furnace system which treats semiconductor wafers without contamination.

The present inventor contemplated the problem, and noticed that the leading end of the outlet gas nozzle had been subjected to an aged deterioration as shown in FIG. 3. The present inventor concluded that a heat cycle promoted the aged deterioration of the outlet gas nozzle and that the broken leading end portion 101e was the source of the contaminant.

To accomplish the object, the present invention proposes to space a flame from leading end of an outlet gas nozzle for hydrogen gas.

In accordance with the present invention, there is provided a furnace system used in a fabrication of a semiconductor device, comprising: a wafer chamber treating at least one semiconductor wafer with heat; a combustion sub-system including a combustion chamber, a first outlet gas nozzle for injecting oxygen gas into the combustion chamber and a second outlet gas nozzle for injecting hydrogen gas into the combustion chamber for generating the heat through a combustion with the oxygen gas; and a guard member provided for the second outlet gas nozzle so as to space a high temperature region of a flame generated in the combustion from the second outlet gas nozzle.

BRIEF DESCRIPTION OF THE DRAWINGS

The features and advantages of the furnace system according to the present invention will be more clearly understood from the following description taken in conjunction with the accompanying drawings in which.

DESCRIPTION OF THE PREFERRED EMBODIMENTS

First Embodiment

Figure 1:
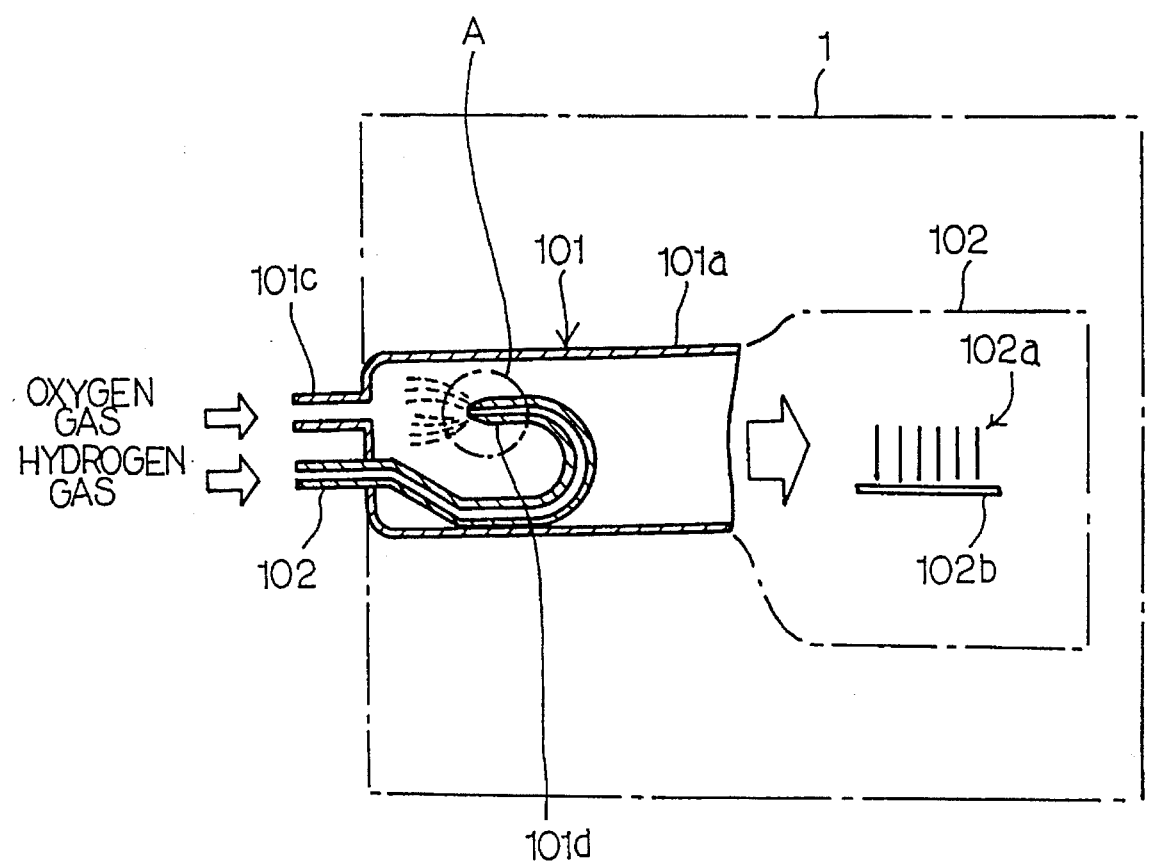
FIG. 1 is a cross sectional schematic view showing the prior art furnace system.
Figure 2:
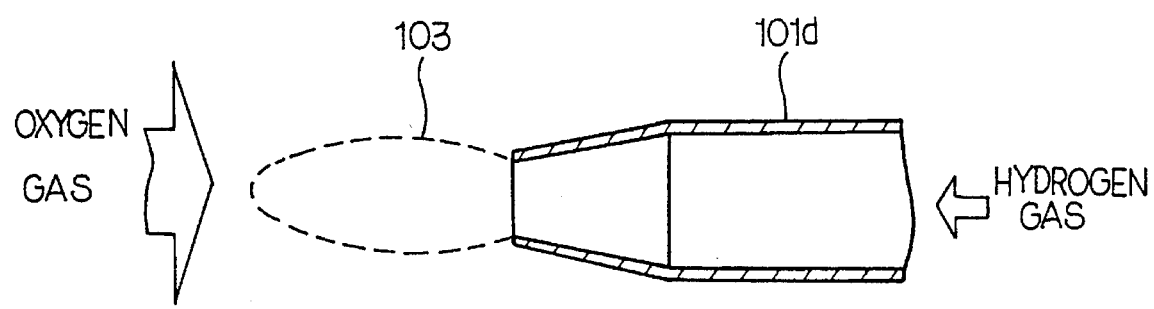
FIG. 2 is a cross sectional view showing the leading end of the outlet gas nozzle of the prior art furnace system encircled in A of FIG. 1.
Figure 3:
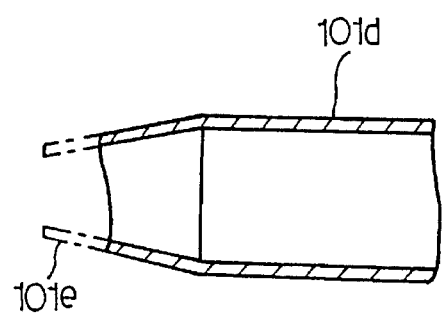
FIG. 3 is a cross sectional view showing the leading end of the outlet gas nozzle subjected to the aged deterioration.
Figure 4:
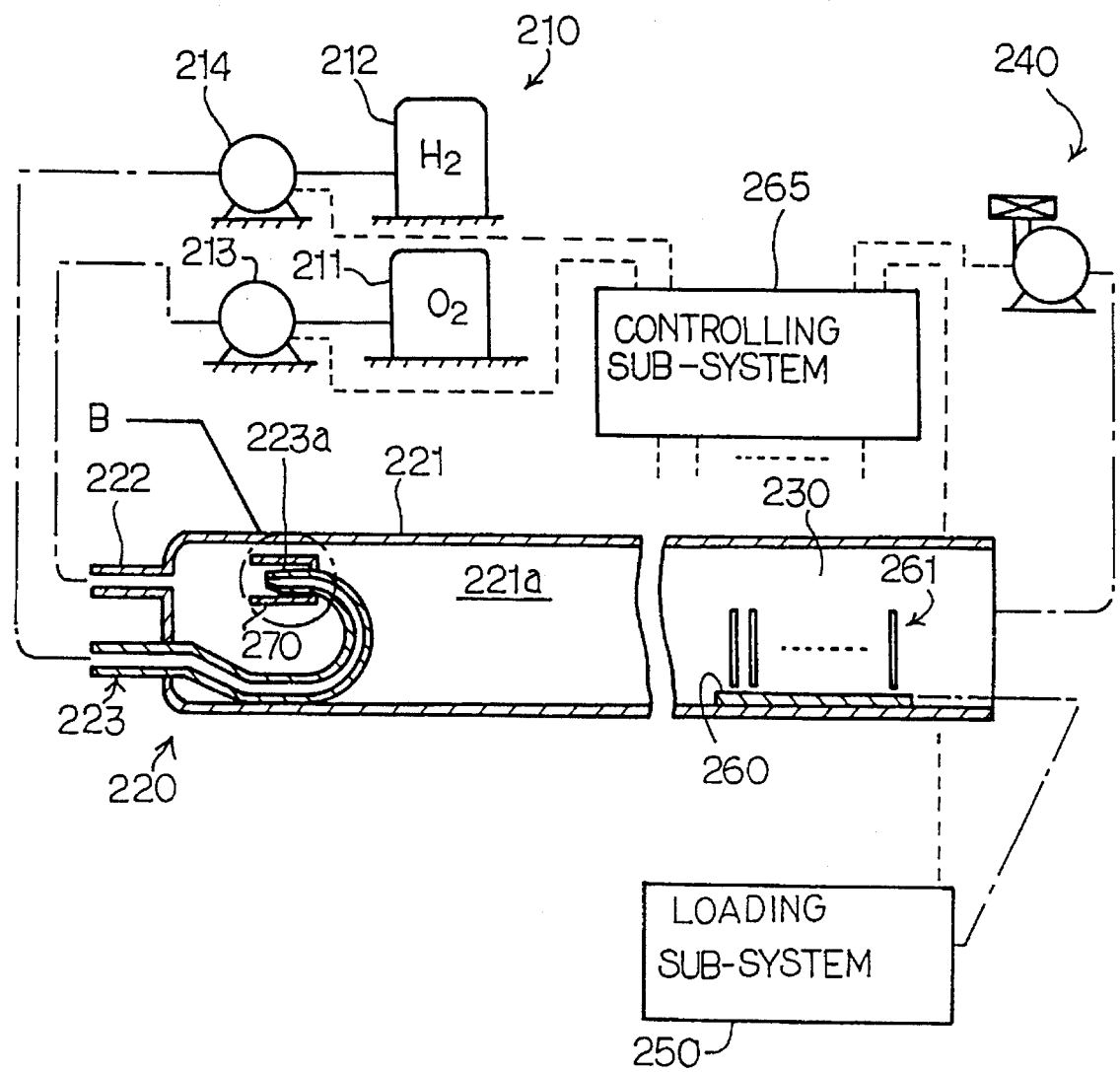
FIG. 4 is a cross sectional schematic view showing a furnace system according to the present invention.

Referring to FIG. 4 of the drawings, a furnace system embodying the present invention largely comprises a gas supply sub-system 210, a combustion sub-system 220 connected to the gas supply sub-system 210, a wafer chamber 230 contiguous to the combustion sub-system 220, an exhausting sub-system 240 connected to the wafer chamber 230, a loading sub-system 250 for loading a boat 260 into and unloading it from the wafer chamber 230 and a controlling sub-system 265 for these sub-systems 210, 220, 240, 250 and 260. The furnace system treats semiconductor wafers 261 in the boat 260 with high-temperature steam, and the high-temperature steam oxidizes exposed surface portions of the semiconductor wafers 261.

The furnace system is available for a thermal diffusion of a dopant impurity into the semiconductor wafers 261.

The gas supply system 210 includes an oxygen gas source 211, a hydrogen gas source 212 and gas pumps 213 and 214 connected to the oxygen gas source 211 and the hydrogen gas source 212, respectively. The gas pumps 213 and 214 are controlled by the controlling sub-system 265, and the flow rates are changeable.

The combustion sub-system 220 includes an appropriate ignition means (not shown), an outer tube member 221, an outlet gas nozzle 222 and an inner tube member 223. The outer tube member 221 defines a combustion chamber 221a contiguous to the wafer chamber 230, and the outlet gas nozzle 222 is open to the combustion chamber 221a for injecting the oxygen gas. The inner tube member 223 is bent to have a U-shape in the combustion chamber 221a, and has an outlet gas nozzle 223a for injecting the hydrogen gas toward the outlet gas nozzle 222. In this instance, both of the outer tube member 221 and the inner tube member 223 are formed of quartz.

While the gas supply sub-system 210 is supplying the hydrogen gas and the oxygen gas into the combustion chamber 221a, the hydrogen gas is mixed with the oxygen gas, and is burnt in the oxygen gas. High-temperature steam is generated through the combustion, and is exhausted through the wafer chamber 230 by means of the exhausting sub-system 240.

The loading sub-system 250 loads the boat 260 holding the semiconductor wafers 261 into the wafer chamber 230, and the high-temperature steam oxidizes the surface portions of the semiconductor wafers 261.

Though not shown in the drawings, the controlling sub-system 265 includes various monitoring sensors, and optimizes the oxidation of the semiconductor wafers 261.

Figure 5:
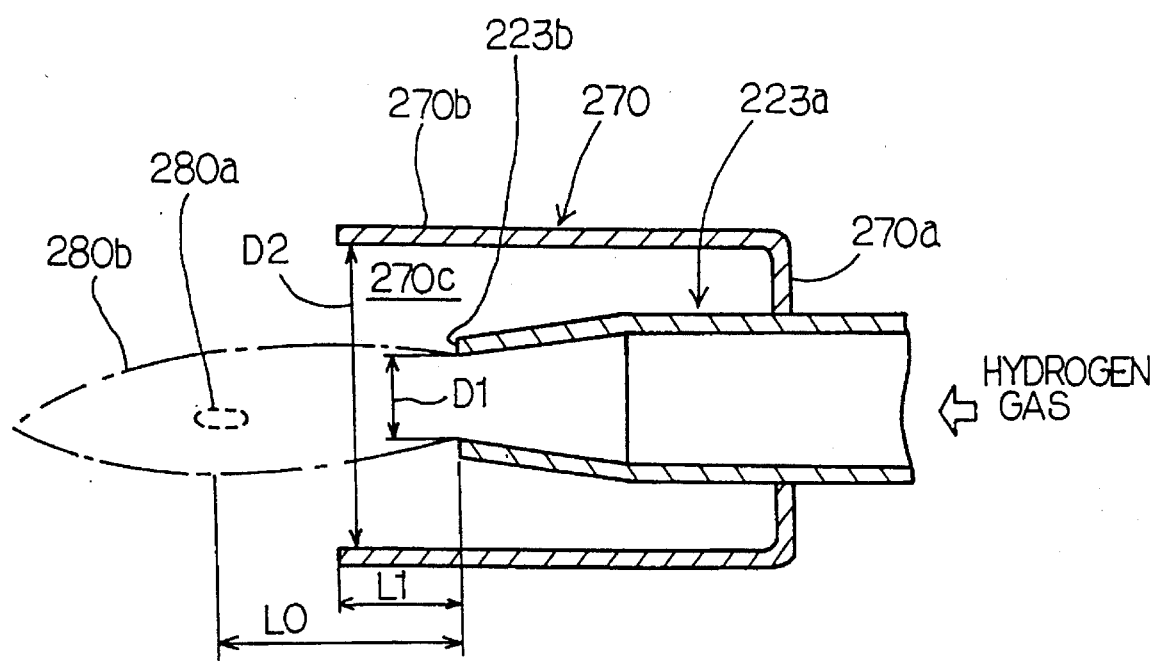
FIG. 5 is a cross sectional view showing an outlet gas nozzle encircled in B of FIG. 4.

As will be better seen in FIG. 5, the furnace system according to the present invention further comprises a guard member 270 provided for the outlet gas nozzle 223a. The guard member 270 is larger in diameter than the outlet gas nozzle 223a, and is shaped into a cylindrical configuration. Namely, the guard member 270 has a flat bottom surface portion 270a and a round side wall portion 270b projecting from the periphery of the flat bottom surface portion 270a. The flat bottom surface portion 270a has a through-hole, and the outlet gas nozzle 223a projects through the through-hole into an inner space 270c defined by the round side wall portion 270b. Thus, the guard member 270 protects an outlet end of the outlet gas nozzle 223a from the oxygen-rich atmosphere created outside thereof.

Assuming now that an operator manipulates the controlling sub-system for an oxidation of the semiconductor wafers 261, the loading sub-system 250 inserts the boat 260 into the wafer chamber 230, and the gas supply sub-system 210 supplies the hydrogen gas and the oxygen gas to the outlet gas nozzles 223a and 222, respectively. The ignition means (not shown) ignites the hydrogen gas, and the hydrogen gas reacts with the oxygen gas for generating the high-temperature steam. The exhaust sub-system 240 drafts the high temperature steam, and the high-temperature steam passes the wafer chamber 230 so as to oxidize the surface portions of the semiconductor wafers 261.

Immediately after the ignition, the inner space 270c is oxygen-rich, and a high-temperature region 280a of a flame 280b is close to the outlet end 223b of the outlet gas nozzle 223a. However, the combustion consumes the oxygen in the inner space 270, and the high-temperature region 280a is spaced from the outlet end 223b as shown. As a result, the temperature at the outlet end 223b does not rise so high.

When the oxidation is completed, the combustion is terminated, and the combustion chamber 221a is cooled gradually. The outlet end 223b is also cooled, and is subjected to a heat-cycle. However, the outlet end 223b does not rise so high as described hereinbefore, and the heat-cycle is milder than that of the prior art furnace systems. For this reason, the outlet end 223b is less damaged, and contaminant supplied from the outlet end 223b is negligible. This means that the semiconductor wafers 261 are not contaminated by the broken particles of the quartz outlet gas nozzle 223a.

The location L0 of the high-temperature region 280a is variable with the geometries of the guard member 270 and the outlet gas nozzle 223a, the amount of oxygen supplied to the combustion chamber 221a and the flow speed of hydrogen. If the oxygen supply is 5 to 20 liters per minute and the flow speed of hydrogen is 1 to 15 meters per second at the outlet end 223b, it is desirable to regulate L1 and {(D2–D1)/2} to 20 to 50 millimeters and 5 to 15 millimeters respectively.

Second Embodiment

Figure 6:
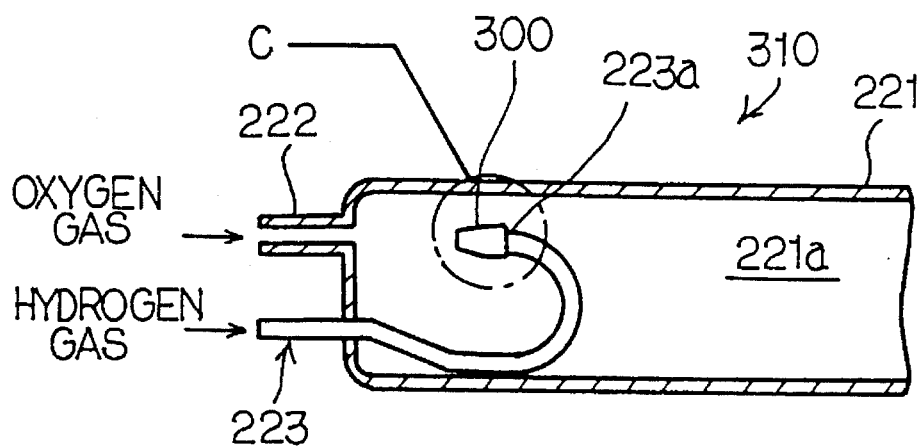
FIG. 6 is a cross sectional schematic view showing a combustion tube incorporated in another furnace system according to the present invention.
Figure 7:
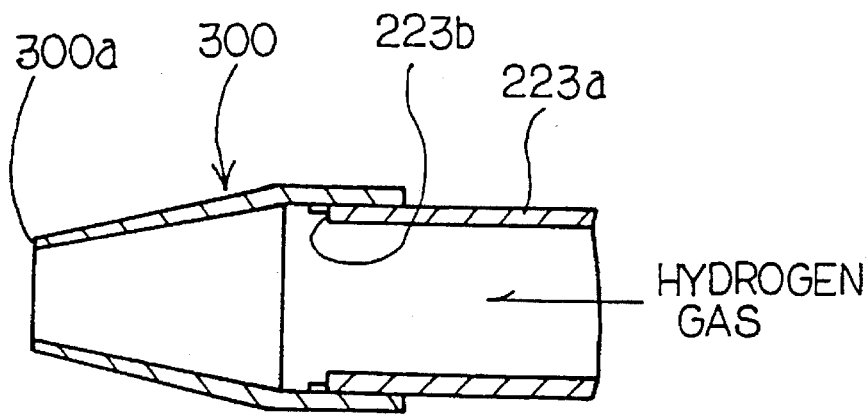
FIG. 7 is a cross sectional view showing a detachable guard member for an outlet gas nozzle encircled in C of FIG. 6.

Turning to FIG. 6 of the drawings, a protective nozzle 300 is associated with a combustion sub-system 310 incorporated in another furnace system embodying the present invention. The furnace system implementing the second embodiment is similar to the first embodiment except for the protective nozzle 300, and the other component parts are labeled with the same references as corresponding parts of the furnace system of the first embodiment.

The protective nozzle 300 is formed of a heat resisting substance such as, for example, silicon carbide, and is detachable to the outlet end 223b of the outlet gas nozzle 223a. The outlet end 223b is snugly received by the protective nozzle 300, and a flame is created at an injecting end 300a of the protective nozzle 300. As a result, a high-temperature region of the flame is spaced from the outlet end 223b, and the outlet end 223b is less damaged by the high-temperature region. The protective nozzle 300 may be formed of silicon.

If a sign of damage such as a crack is found in the protective nozzle 300, the manufacturer changes the protective nozzle 300 before serious damage occurs, and the semiconductor wafers 261 are prevented from being contaminated. In this instance, the protective nozzle 300 serves as a guard member.

Although particular embodiments of the present invention have been shown and described, it will be obvious to those skilled in the art that various changes and modifications may be made without departing from the spirit and scope of the present invention.

For example, the wafer chamber 230 may be separated from the combustion tube so as to treat the semiconductor wafers 261 with heat. The furnace system according to the present invention is available for a high temperature process stage.

The gas is not limited to hydrogen, and the guard member according to the present invention is effective against a heat-cycle at the outlet gas nozzle.

What is claimed is:

1. A furnace system used in a fabrication of a semiconductor device, comprising:

a wafer chamber for treating at least one semiconductor wafer with heat;

a combustion sub-system including a combustion chamber, a first outlet gas nozzle for injecting oxygen gas into said combustion chamber and a second outlet gas nozzle formed of quartz for injecting hydrogen gas into said combustion chamber for generating said heat through a combustion with said oxygen gas; and a guard member provided for said second outlet gas nozzle so as to space a high temperature region of a flame generated in said combustion from said second outlet gas nozzle, thereby preventing breakage of said second outlet nozzle due to said high temperature region.

2. The furnace system as set forth in claim 1, in which said second outlet gas nozzle projects into an inner space defined by said guard member and open to said combustion chamber.

3. The furnace system as set forth in claim 2, in which said first outlet gas nozzle is opposed to said second gas nozzle in said combustion chamber so as to inject said oxygen gas toward the inner space.

4. The furnace system as set forth in claim 1, in which said guard member is formed of a heat-resisting substance, and defines an inner space into which said second outlet gas nozzle projects.

5. The furnace system as set forth in claim 4, in which said heat-resisting substance is silicon carbide.

6. The furnace system as set forth in claim 1, in which said guard member comprises a protective nozzle formed of a heat-resisting substance, and said protective nozzle is detachable from said second outlet gas nozzle, said second outlet gas nozzle projecting into an inner space defined by said protective nozzle.

7. The furnace system as set forth in claim 6, in which said heat-resisting substance is silicon carbide.

8. A furnace system according to claim 1, wherein said guard member has a diameter larger than that of said second outlet gas nozzle and has a cylindrical cross-sectional shape.

9. A furnace system according to claim 1, wherein said guard member includes a flat surface portion and a round wall portion projecting from a periphery of said flat surface portion.

10. A furnace system according to claim 9, wherein said guard member further includes an inner space defined by said round wall portion, and wherein said flat surface portion includes a through-hole, and said second outlet gas nozzle projects through said through-hole into said inner space, said guard member for protecting an outlet end of said second outlet gas nozzle from an oxygen-rich atmosphere created outside thereof.

11. A furnace system according to claim 10, wherein said combustion consumes said oxygen gas in said inner space.

12. A furnace system according to claim 1, wherein said first outlet gas nozzle comprises a quartz nozzle.

13. A furnace system used in a fabrication of a semiconductor device comprising:

a wafer chamber for treating at least one semiconductor wafer with heat;

a combustion sub-system including a combustion chamber, a first outlet gas nozzle for injecting oxygen gas into said combustion chamber at 5 to 20 liters per minute, and a second outlet gas nozzle opposed to said first outlet gas nozzle for injecting hydrogen gas into said combustion chamber at 2 to 15 meters per second for generating said heat through a combustion with said oxygen gas; and a guard member defining an inner space for receiving said second outlet gas nozzle and open to said combustion on chamber at one end thereof so as to space a high temperature region of a flame generated in said combustion from said second outlet gas nozzle, a half of a difference in diameter between said guard member and said second outlet gas nozzle ranging from 5 to 15 millimeters, an outlet end of said guard member open to said combustion chamber being spaced from said nozzle by 20 to 50 millimeters.

14. A furnace system according to claim 13, wherein said guard member has a diameter larger than that of said second outlet gas nozzle and has a cylindrical cross-sectional shape, and wherein said guard member prevents breakage of said second outlet gas nozzle due to said high temperature region.

15. A furnace system according to claim 13, wherein said guard member includes a flat surface portion and a round wall portion projecting from a periphery of said flat surface portion.

16. A furnace system according to claim 15, wherein said guard member further includes an inner space defined by said round wall portion, and wherein said flat surface portion includes a through-hole, and said second outlet gas nozzle projects through said through-hole into said inner space, said guard member for protecting an outlet end of said second outlet gas nozzle from an oxygen-rich atmosphere created outside thereof.

17. A furnace system according to claim 16, wherein said combustion consumes said oxygen gas in said inner space.

18. A furnace system according to claim 13, wherein said first outlet gas nozzle comprises a quartz nozzle.

\* \* \* \* \*